(12) United States Patent
Zhou et al.

(10) Patent No.: US 9,337,064 B2
(45) Date of Patent: May 10, 2016

(54) METHODS OF PROTECTING PERIPHERIES OF IN-PROCESS SEMICONDUCTOR WAFERS AND RELATED IN-PROCESS WAFERS AND SYSTEMS

(71) Applicant: Micron Technology, Inc., Boise, ID (US)

(72) Inventors: Wei Zhou, Singapore (SG); Aibin Yu, Singapore (SG); Zhaohui Ma, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/485,973

(22) Filed: Sep. 15, 2014

(65) Prior Publication Data

US 2016/0079094 A1 Mar. 17, 2016

(51) Int. Cl.
*H01L 23/495* (2006.01)
*H01L 23/58* (2006.01)
*H01L 21/00* (2006.01)
(Continued)

(52) U.S. Cl.
CPC ........ *H01L 21/565* (2013.01); *H01L 21/30604* (2013.01); *H01L 21/31111* (2013.01); *H01L 21/324* (2013.01); *H01L 21/568* (2013.01); *H01L 23/3157* (2013.01)

(58) Field of Classification Search
CPC ..... H01L 21/56; H01L 21/2007; H01L 21/30; H01L 23/49811; H01L 21/76898; H01L 21/565; H01L 21/31111; H01L 21/568; H01L 21/324; H01L 23/3157
USPC .......... 257/672, 666, 787, E21.504, E23.125, 257/E25.011, 778, 629, E21.499; 438/455, 438/126, 26, 459, 107, 458
See application file for complete search history.

(56) References Cited

U.S. PATENT DOCUMENTS 5,744,084 A * 4/1998 Chia et al. ...................... 264/276
5,937,312 A * 8/1999 Iyer et al. ...................... 438/459
(Continued)

FOREIGN PATENT DOCUMENTS

KR 1020140034909 A 3/2014

OTHER PUBLICATIONS

3M™ Wafer Support System, Temporary Wafer Bonding for Advanced IC Packaging, http://multimedia.3m.com/mws/mediawebserver?mwsId=SSSSSuH8gc7nZxtUMYtGP8_ZevUqe17zHvTSevTSeSSSSSS--&fn=sellsht_wafer_support.pdf, (2009), 4 pages.
(Continued)

*Primary Examiner* — Long K Tran
*Assistant Examiner* — Dzung Tran
(74) *Attorney, Agent, or Firm* — TraskBritt

(57) ABSTRACT

Methods of processing semiconductor wafers may involve, for example, encapsulating an active surface and each side surface of a wafer of semiconductor material, a plurality of semiconductor devices located on the active surface of the wafer, an exposed side surface of an adhesive material located on a back side surface of the wafer, and at least a portion of a side surface of a carrier substrate secured to the wafer by the adhesive material in an encapsulation material. At least a portion of the side surface of the adhesive material may be exposed by removing at least a portion of the encapsulation material. The carrier substrate may be detached from the wafer. Processing systems and in-process semiconductor wafers are also disclosed.

16 Claims, 3 Drawing Sheets

(51) Int. Cl.
*H01L 21/56* (2006.01)
*H01L 21/311* (2006.01)
*H01L 21/306* (2006.01)
*H01L 21/324* (2006.01)
*H01L 23/31* (2006.01)

(56) References Cited

U.S. PATENT DOCUMENTS

| | | |
|---|---|---|
| 6,245,595 B1 | 6/2001 | Nguyen et al. |
| 6,417,108 B1 * | 7/2002 | Akino et al. ............ 438/690 |
| 6,770,163 B1 | 8/2004 | Kuah et al. |
| 8,119,500 B2 | 2/2012 | Yang et al. |
| 8,252,665 B2 | 8/2012 | Chiou et al. |
| 2002/0089067 A1 * | 7/2002 | Crane et al. ............ 257/778 |
| 2004/0178514 A1 | 9/2004 | Lee et al. |
| 2008/0268614 A1 | 10/2008 | Yang et al. |
| 2011/0097874 A1 * | 4/2011 | Broekaart et al. ........ 438/459 |
| 2012/0168962 A1 | 7/2012 | Yang et al. |
| 2012/0211896 A1 | 8/2012 | Jeung et al. |
| 2013/0082406 A1 * | 4/2013 | Bruendel et al. ......... 257/778 |
| 2013/0228920 A1 | 9/2013 | Chiou et al. |
| 2013/0328174 A1 * | 12/2013 | La Tulipe et al. ........ 257/629 |

OTHER PUBLICATIONS

International Search Report of the International Application No. PCT/US2015/048600, mailed Dec. 15, 2015, 3 pages.
Written Opinion of the International Application No. PCT/US2015/048600, mailed Dec. 15, 2015, 7 pages.

* cited by examiner

METHODS OF PROTECTING PERIPHERIES OF IN-PROCESS SEMICONDUCTOR WAFERS AND RELATED IN-PROCESS WAFERS AND SYSTEMS

FIELD

This disclosure relates generally to semiconductor wafers and methods of protecting semiconductor wafers. More specifically, disclosed embodiments relate to methods of protecting peripheries of semiconductor wafers during processing, and to related in-process wafers.

BACKGROUND

Active surfaces of in-process semiconductor wafers, and semiconductor devices comprising stacks of semiconductor dice located on those active surfaces, may be at least partially encapsulated in encapsulation materials. For example, encapsulation material may be dispensed over a portion of the active surface of a thinned semiconductor wafer supported by a carrier to cover and protect semiconductor devices located on the active surface. More specifically, a mold body having a smaller inner diameter than an outer diameter of the wafer may be used to contact a major surface, such as the active surface, of the wafer around a periphery of the wafer. Encapsulation material in the form of a so-called molding compound may flow into the mold, over the active surface, and over and around each semiconductor device. The encapsulation material may be cured, and the mold may be removed from contact with the periphery of the wafer. Contact of the mold body with the wafer surface prevents contamination by preventing the mold compound from reaching the edge of the wafer.

However, the above approach results, after debonding of the wafer from the carrier, exposure of the wafer edge, which is vulnerable to edge chipping and cracking, causing handling issues.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device, wafer of semiconductor material, act in a method of protecting a wafer, or component thereof, but are merely idealized representations employed to describe illustrative embodiments. Thus, the drawings are not necessarily to scale.

Disclosed embodiments relate generally to methods of protecting peripheries of semiconductor wafers and related systems and apparatuses. More specifically, disclosed are embodiments of methods of protecting peripheries of wafers of semiconductor material that may involve more fully encapsulating active surfaces of the wafers, and semiconductor devices on the active surfaces, in encapsulation materials, such that the encapsulation materials protect the peripheries of the semiconductor wafers.

As noted above, when the mold body used for encapsulation contacts a major surface, such as the active surface at the periphery of a wafer, the periphery may not be encapsulated in encapsulation material because it is covered by the mold. The unencapsulated periphery of the wafer may then be vulnerable to damage. For example, the wafer may be thin, on the order of about 40 μm to about 60 μm thickness, and of brittle semiconductor material, typically silicon. As the wafer requires additional processing, shipping, and other handling after it has been detached from the carrier substrate, the periphery of the wafer may crack, chip, or otherwise become damaged. The damage to the periphery may even affect other areas of the wafer, as cracks propagate from the periphery radially inward. As a result, semiconductor devices on the active surface of the wafer may become damaged, reducing yield.

In addition, forcing the mold against the periphery of the wafer may introduce unnecessary stress into the wafer. For example, the mold may press with a force of 100 kN or greater (e.g., 200 kN or greater) against the active surface at the periphery of the wafer. Stress within the wafer may exceed 2 MPa, 4 MPa, or even 9 MPa, which may introduce cracks that subsequently may propagate to damage the wafer.

Figure 1:
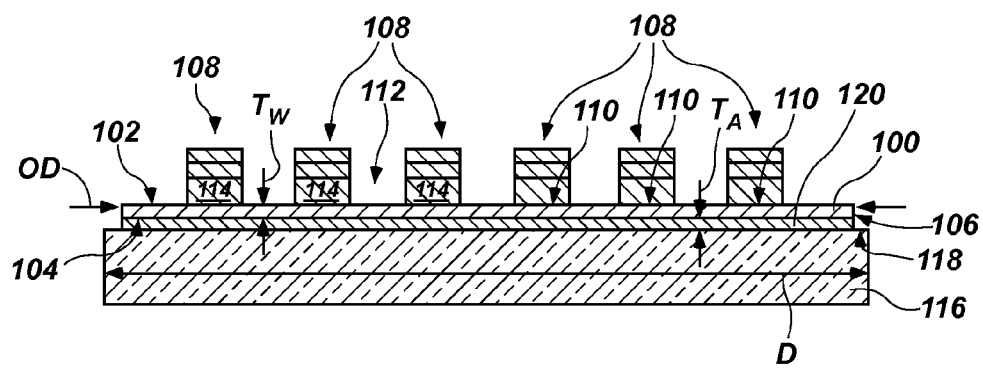
FIG. 1 is a cross-sectional view of a wafer of semiconductor material.

Referring to FIG. 1, a cross-sectional view of a wafer 100 of semiconductor material is shown. The wafer 100 may be, for example, a thin sheet of semiconductor material, and may include an active surface 102 on one side of the wafer 100 and a back side surface 104 on another, opposing side of the wafer 100. A side surface 106 or side surfaces may extend between, and intersect with, the active surface 102 and the back side surface 104 at a periphery of the wafer 100. More specifically, the wafer 100 may be, for example, a thin, at least substantially circular disc of silicon material. A thickness $T_W$ of the wafer 100 may be, for example, about 500 microns or less. More specifically, the thickness $T_W$ of the wafer 100 may be, for example, about 100 microns or less. As a specific, non-limiting example, the thickness $T_W$ of the wafer 100 may be about 50 microns or less (e.g., about 40 microns). In embodiments where the wafer 100 is circular, an outer diameter OD of the wafer 100 may be, for example, about 100 mm or greater. More specifically, the outer diameter OD of the wafer 100 may be, for example, about 200 mm or greater. As a specific, nonlimiting example, the outer diameter OD of the wafer 100 may be about 300 mm or greater.

At least one semiconductor device 108 may be located on the active surface 102 of the wafer 100. For example, the wafer 100 may include a plurality of semiconductor devices 108 distributed on the active surface 102 of the wafer 100. At least one semiconductor device 108 may include, for example, integrated circuitry 110 embedded within the active surface 102 of the wafer 100. More specifically, each semiconductor device 108 may include, for example, integrated circuitry 110 confined within a predetermined area on the active surface 102 of the wafer 100. Streets 112 may be defined between the semiconductor devices 108 on the active surface 102. At least one semiconductor device 108 may include, for example, at least one semiconductor die 114 located on the active surface 102. More specifically, each semiconductor device 108 may include a stack of semiconductor dice 114 positioned over the active surface 102. The semiconductor dice 114 may be electrically connected to each other and to the integrated circuitry 110 of an unsingulated semiconductor die 114 of the wafer 100, and may be physically secured to the wafer 100.

The wafer 100 may be secured to a carrier substrate 116 to reinforce the wafer 100. The carrier substrate 116 may be, for example, a rigid sheet of material (e.g., semiconductor material or glass material) configured to support and protect the wafer 100. In some embodiments, the carrier substrate 116 may be larger than the wafer 100. For example, a surface area of an upper surface 118 of the carrier substrate 116 may be greater than a surface area of the active surface 102 of the wafer 100. More specifically, a diameter D of the carrier substrate 116 may be greater than the outer diameter OD of the wafer 100 in embodiments where a cross-section of each of the carrier substrate 116 and the wafer 100 is circular. As a specific, nonlimiting example, the diameter D of the carrier substrate 116 may be between about 1 mm and about 50 mm (e.g., about 5 mm) greater than the outer diameter OD of the wafer 100. In other embodiments, the diameter D of the carrier substrate 116 may be at least substantially equal to the outer diameter OD of the wafer 100.

An adhesive material 120 may be positioned between the wafer 100 and the carrier substrate 116. More specifically, the adhesive material 120 may contact the back side surface 104 of the wafer 100 and the upper surface 118 of the carrier substrate 116 to secure the wafer 100 to the carrier substrate 116. As specific, nonlimiting examples, the adhesive material 120 may be WaferBOND® HT-10.10 or BrewerBOND® 220 from Brewer Science, Inc. of Rolla, Mo.; LC3200, LC5300, or LC5320 from 3M of Murray, Utah; Tri-layer temporary bonding material from Shin-Etsu Chemical Co. of Tokyo, Japan; or A4004 or A4007 from TOK of Hillsboro, Oreg. A thickness $T_A$ of the adhesive material 120 may be, for example, between about 20 microns and about 200 microns. More specifically, the thickness $T_A$ of the adhesive material 120 may be, for example, between about 40 microns and about 100 microns. As a specific, nonlimiting example, the thickness $T_A$ of the adhesive material 120 may be between about 50 microns and about 80 microns (e.g., about 65 microns).

Figure 2:
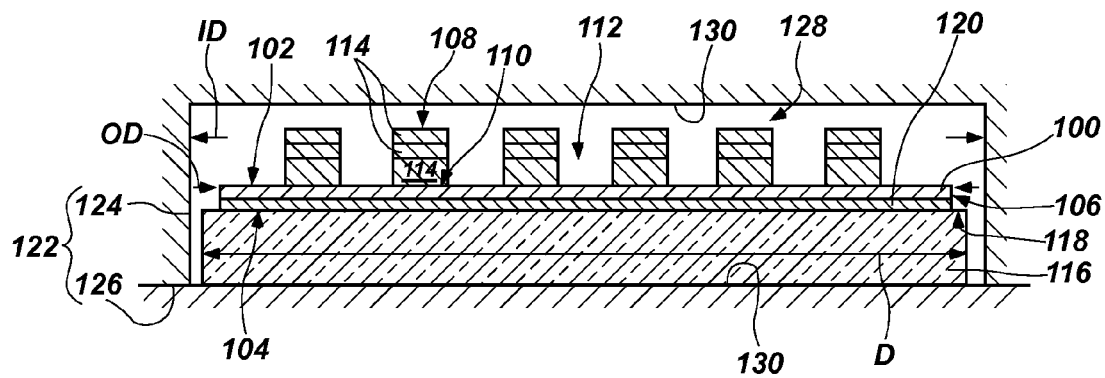
FIG. 2 is a cross-sectional view of the wafer of FIG. 1 in an encapsulation mold.

FIG. 2 is a cross-sectional view of the wafer 100 of FIG. 1 disposed in an encapsulation mold 122. More specifically, the wafer 100, the semiconductor devices 108 on the active surface 102 of the wafer 100, and at least a portion of the adhesive material 120 may be positioned in the mold 122. As a specific, nonlimiting example, the wafer 100, the semiconductor devices 108, the adhesive material 120, and at least a portion of the carrier substrate 116 (e.g., the entire carrier substrate 116) may be positioned within the mold 122.

The mold 122 may include, for example, an upper mold member 124 and a lower mold member 126. The upper mold member 124 may define a recess 128 (e.g., a concavity) within the upper mold member 124 sized to receive the wafer 100, the semiconductor devices 108 on the active surface 102 of the wafer 100, and at least a portion of the adhesive material 120 within the recess 128. More specifically, the upper mold member 124 may define a recess 128 sized and shaped to receive the wafer 100, the semiconductor devices 108, the adhesive material 120, and at least a portion of the carrier substrate 116 (e.g., the entire carrier substrate 116) may be positioned in the mold 122.

An inner diameter ID of the recess 128 defined by the upper mold member 124 may be greater than the outer diameter OD of the wafer 100. For example, the inner diameter ID of the recess 128 may be between about 0.001% and about 10% greater than the outer diameter OD of the wafer 100. More specifically, the inner diameter ID of the recess 128 may be, for example, between about 0.002% and about 5% greater than the outer diameter OD of the wafer 100. As a specific, nonlimiting example, the inner diameter ID of the recess 128 may be between about 0.003% and about 1% (e.g., about 0.05%) greater than the outer diameter OD of the wafer 100. The inner diameter ID of the recess 128 may be, for example, about 30 mm or less greater than the outer diameter OD of the wafer 100. More specifically, the inner diameter ID of the recess 128 may be, for example, about 10 mm or less greater than the outer diameter OD of the wafer 100. As a specific, nonlimiting example, the inner diameter ID of the recess 128 may be about 5 mm or less (e.g., about 1 mm) greater than the outer diameter OD of the wafer 100.

The inner diameter ID of the recess 128 defined by the upper mold member 124 may be greater than the diameter D of the carrier substrate 116. For example, the inner diameter ID of the recess 128 may be between about 0.001% and about 9% greater than the diameter D of the carrier substrate 116. More specifically, the inner diameter ID of the recess 128 may be, for example, between about 0.002% and about 4% greater than the diameter D of the carrier substrate 116. As a specific, nonlimiting example, the inner diameter ID of the recess 128 may be between about 0.003% and about 0.09% (e.g., about 0.09%) greater than the diameter D of the carrier substrate 116. The inner diameter ID of the recess 128 may be, for example, about 10 mm or less greater than the diameter D of the carrier substrate 116. More specifically, the inner diameter ID of the recess 128 may be, for example, about 5 mm or less greater than the diameter D of the carrier substrate 116. As a specific, nonlimiting example, the inner diameter ID of the recess 128 may be about 2.5 mm or less (e.g., about 1 mm) greater than the diameter D of the carrier substrate 116.

The upper mold member 124 may not contact the wafer 100 when enclosing the semiconductor devices 108 within the recess 128, which may eliminate the imposition of stress on the wafer 100 in comparison to use of a conventional mold body. More specifically, the upper mold member 124 may not contact the active surface 102 of the wafer 100 at a periphery of the wafer 100 when enclosing the semiconductor devices 108 within the recess 128. In some embodiments, the upper mold member 124 may not contact the wafer 100, the adhesive material 120, or the carrier substrate 116. For example, the upper mold member 124 may contact the lower mold member 126 to enclose the wafer 100, adhesive material 120, and carrier substrate 116 within the recess 128. More specifically, the carrier substrate 116 may be supported on the lower mold member 126, and the upper mold member 124 may contact and be pressed against the lower mold member 126 to enclose the wafer 100, adhesive material 120, and carrier substrate 116 within the recess 128.

Surfaces of the upper mold member 124 and the lower mold member 126 facing the recess 128 may be lined with a release material 130. For example, the release material 130 may coat the surfaces of the upper mold member 124 defining the recess 128 and the surface of the lower mold member 126 on which the carrier substrate 116 may be supported. The release material 130 may enable easier subsequent release from the mold 122. The release material 130 may be, for example, ETFE film 50MW 390NT or ETFE film 50HK 390NT from AGC of Exton, Pa. In some embodiments, the release material 130 on the upper mold member 124 may be different from the release material 130 on the lower mold member 126. In other embodiments, the release material 130 on the upper mold member 124 may be the same as the release material 130 on the lower mold member 126.

Figure 3:
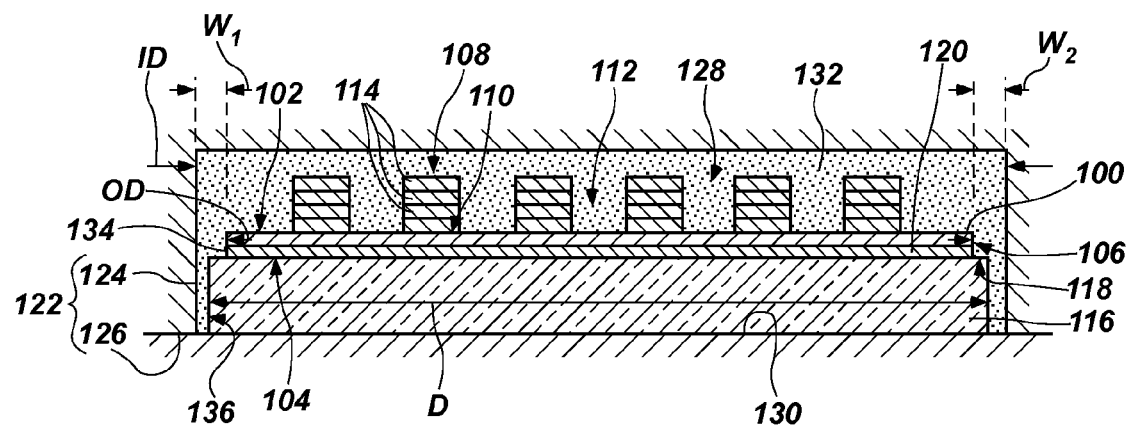
FIG. 3 is a cross-sectional view of the wafer of FIG. 2 with encapsulation material.

FIG. 3 is a cross-sectional view of the wafer 100 of FIG. 2 with encapsulation material 132. For example, encapsulation material 132 may be positioned in the mold 122 over exposed surfaces of the wafer 100, exposed surfaces of the semiconductor devices 108 on the active surface 102 of the wafer 100, and exposed surfaces of the adhesive material 120. More specifically, encapsulation material 132 in a flowable state may be dispensed into the mold 122 around the active surface 102 and each side surface 106 of the wafer 100, at least partially surrounding the semiconductor devices 108, around each side surface 134 of the adhesive material 120, and at least partially along each side surface 136 of the carrier substrate 116. As a specific, nonlimiting example, fluid encapsulation material 132 may flow into the recess 128 of the mold 122 under vacuum to contact and cover the active surface 102 and each side surface 106 of the wafer 100, to surround the exposed side and, optionally, top surfaces of the semiconductor devices 108, to contact and cover each side surface 134 of the adhesive material 120, and to contact and cover each side surface 136 of the carrier substrate 116. The encapsulation material 132 may subsequently be cured to an at least substantially solid state.

A width $W_1$ of the encapsulation material 132 proximate a periphery of the wafer 100 may be, for example, between about 0.001% and about 10% of the outer diameter OD of the wafer 100. More specifically, the width $W_1$ of the encapsulation material 132 proximate the periphery of the wafer 100 may be, for example, between about 0.002% and about 5% of the outer diameter OD of the wafer 100. As a specific, nonlimiting example, the width $W_1$ of the encapsulation material 132 proximate the periphery of the wafer 100 may be between about 0.003% and about 1% (e.g., about 0.05%) of the outer diameter OD of the wafer 100. The width $W_1$ of the encapsulation material 132 proximate the periphery of the wafer 100 may be, for example, about 30 mm or less. More specifically, the width $W_1$ of the encapsulation material 132 proximate the periphery of the wafer 100 may be, for example, about 10 mm or less. As a specific, nonlimiting example, the width $W_1$ of the encapsulation material 132 proximate the periphery of the wafer 100 may be about 5 mm or less (e.g., about 1 mm).

The width $W_2$ of the encapsulation material 132 proximate a periphery of the carrier substrate 116 may be, for example, between about 0.001% and about 9% of the diameter D of the carrier substrate 116. More specifically, the width $W_2$ of the encapsulation material 132 proximate the periphery of the carrier substrate 116 may be, for example, between about 0.002% and about 4% of the diameter D of the carrier substrate 116. As a specific, nonlimiting example, the width $W_2$ of the encapsulation material 132 proximate the periphery of the carrier substrate 116 may be between about 0.003% and about 0.09% (e.g., about 0.09%) of the diameter D of the carrier substrate 116. The width $W_2$ of the encapsulation material 132 proximate the periphery of the carrier substrate 116 may be, for example, about 10 mm or less. More specifically, the width $W_2$ of the encapsulation material 132 proximate the periphery of the carrier substrate 116 may be, for example, about 5 mm or less. As a specific, nonlimiting example, the width $W_2$ of the encapsulation material 132 proximate the periphery of the carrier substrate 116 may be about 2.5 mm or less (e.g., about 1 mm).

Figure 4:
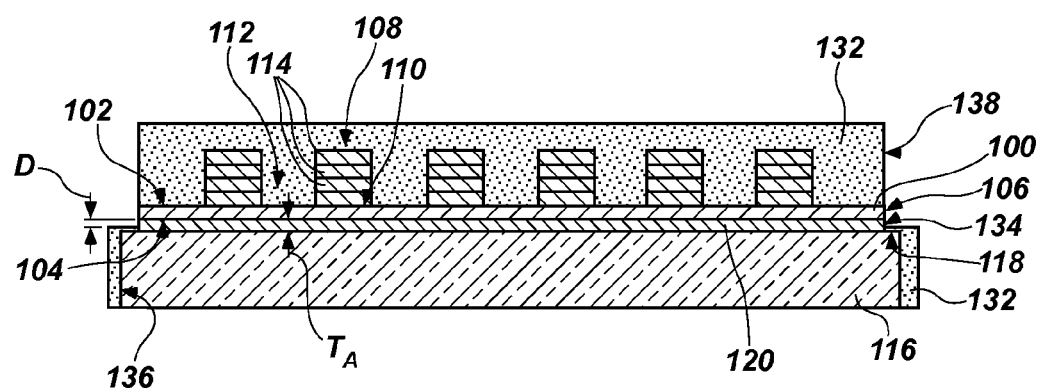
FIG. 4 is a cross-sectional view of the wafer of FIG. 3 after removing a portion of the encapsulation material.

FIG. 4 is a cross-sectional view of the wafer 100 of FIG. 3 after removing a portion of the encapsulation material 132. For example, the wafer 100, semiconductor devices 108, adhesive material 120, carrier substrate 116, and encapsulation material 132 may be removed from within the encapsulation mold 122, and a portion of the encapsulation material 132 covering a periphery of the adhesive material 120 may be removed to expose at least a portion of the adhesive material 120 at the periphery. More specifically, a portion of the encapsulation material 132 covering a periphery of the wafer 100 and a periphery of the adhesive material 120 may be removed to expose each side surface 106 of the wafer 100 and a portion of the adhesive material 120 at the periphery. As a specific, nonlimiting example, a wafer-trimming device (e.g., a saw blade) may be used to remove a portion of the encapsulation material 132 covering a periphery of the wafer 100 and a periphery of the adhesive material 120 starting from a periphery of the encapsulation material 132 and proceeding radially inward toward the wafer 100 and adhesive material 120 to expose each side surface 106 of the wafer 100 and a portion of the side surface 134 of the adhesive material 120. Exposing at least a portion of the adhesive material 120 may facilitate subsequent detachment of the wafer 100 from the carrier substrate 116.

At least one side surface 138 of the encapsulation material 132 may be at least substantially flush with at least one corresponding side surface 106 of the wafer 100. For example, each side surface 138 of the encapsulation material 132 may be at least substantially flush with a corresponding side surface 106 of the wafer 100. More specifically, a single, annular side surface 138 defined by the encapsulation material 132, which may exhibit a circular cross-sectional shape, may be at least substantially flush with a corresponding, annular side surface 106 of the wafer 100, which may similarly exhibit a circular cross-sectional shape. In other words, the side surface 138 defined by the encapsulation material 132 and the side surface 106 defined by the wafer 100 may cooperatively define a contiguous, uninterrupted side surface. More specifically, there may be no ledge defined by the periphery of the wafer 100, which may not project laterally beyond the side surface 138 of the encapsulation material 132.

When only a portion of an edge of the adhesive material 120 is exposed, the adhesive material 120 may be exposed to a depth D of, for example, between about 1% and about 80% of the thickness $T_A$ of the adhesive material 120. More specifically, the adhesive material 120 may be exposed to a depth D of for example, between about 25% and about 65% of the thickness $T_A$ of the adhesive material 120. As a specific, nonlimiting example, the adhesive material 120 may be exposed to a depth D of, for example, between about 40% and about 60% (e.g., about 50%) of the thickness $T_A$ of the adhesive material 120. The adhesive material 120 may be exposed to a depth D of, for example, between about 0.2 microns and about 160 microns, as measured from the back side surface 104 of the wafer 100. More specifically, the adhesive material 120 may be exposed to a depth D of, for example, between about 20 microns and about 80 microns. As a specific, nonlimiting example, the adhesive material 120 may be exposed to a depth D of, for example, between about 40 microns and about 60 microns (e.g., about 50 microns).

In some embodiments, a portion of the adhesive material 120 may be removed to expose an underlying portion of the adhesive material 120. For example, as the removal device moves radially inward and encounters the side surface 134 of the adhesive material 120, the removal device may begin removing some of the adhesive material 120 at the periphery and define a new side surface 134. More specifically, the removal device may leave a ledge (e.g., a notch) in the adhesive material 120 at the periphery of the adhesive material 120.

In some embodiments, a portion of the semiconductor material of the wafer 100 may be removed when exposing the adhesive material 120. For example, as the removal device moves radially inward and encounters the side surface 106 of the wafer 100, the removal device may begin removing some of the semiconductor material at the periphery of wafer 100 and define a new side surface 106. More specifically, the removal device may reduce the outer diameter OD of the wafer 100 as it exposes the adhesive material 120 and renders the encapsulation material 132 at least substantially flush with the side surface 106 of the wafer 100. The outer diameter OD of the wafer 100 may be reduced, for example, by between about 0.01% and about 10%. More specifically, the outer diameter OD of the wafer 100 may be reduced, for example, by between about 0.05% and about 5%. As a specific, nonlimiting example, the outer diameter OD of the wafer 100 may be reduced by between about 0.1% and about 2.5% (e.g., about 1%). The outer diameter OD of the wafer 100 may be reduced, for example, by about 20 mm or less. More specifically, the outer diameter OD of the wafer 100 may be reduced, for example, by about 10 mm or less. As a specific, nonlimiting example, the outer diameter OD of the wafer 100 may be reduced by between about 5 mm or less (e.g., about 4 mm).

In some embodiments, encapsulation material 132 may remain on at least a portion of side surface 136 of the carrier substrate 116. For example, the encapsulation material 132 may be removed from the periphery inward only to a position within the thickness $T_A$ of the adhesive material 120, leaving encapsulation material 132 below that position in place. More specifically, the encapsulation material 132, any semiconductor material of the wafer 100, and any adhesive material 120 may be removed from the periphery inward to a position within the thickness TA of the adhesive material 120, leaving encapsulation material 132 on the upper surface 118 and the side surface 136 of the carrier substrate 116. In some embodiments, the encapsulation material 132 may then be removed from the carrier substrate 116 after debonding of wafer 100, and the carrier substrate 116 may be reused with another wafer.

Figure 5:
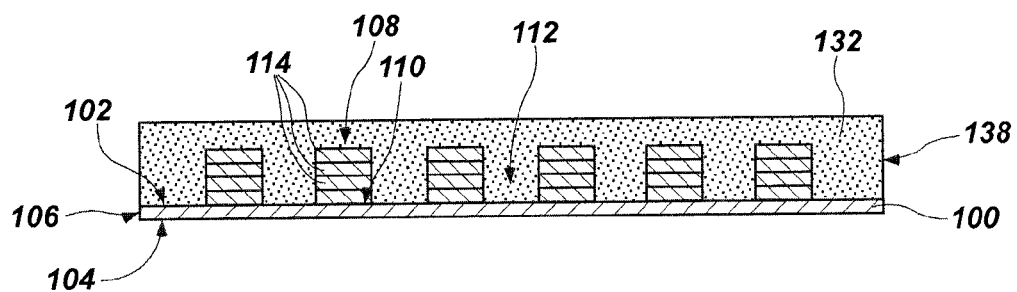
FIG. 5 is a cross-sectional view of the wafer of FIG. 4 after detaching a carrier substrate from the wafer.

FIG. 5 is a cross-sectional view of the wafer 100 of FIG. 4 after debonding the carrier substrate 116 from the wafer 100. More specifically, the wafer 100, the semiconductor devices 108 on the active surface 102 of the wafer 100, and the encapsulation material 132 covering the active surface 102 of the wafer 100 may be removed from the adhesive material 120 and the carrier substrate 116. For example, the adhesive material 120 may be heated to weaken its attachment to the wafer 100. The wafer 100 and carrier substrate 116 may then be detached from one another by sliding one or both of the wafer 100 and the carrier substrate 116 laterally with respect to one another until they are no longer secured to one another.

In other words, methods of processing semiconductor wafers may involve, for example, encapsulating an active surface and each side surface of a wafer of semiconductor material, a plurality of semiconductor devices located on the active surface of the wafer, an exposed side surface of an adhesive material located on a back side surface of the wafer, and at least a portion of a side surface of a carrier substrate secured to the wafer by the adhesive material in an encapsulation material. At least a portion of the side surface of the adhesive material may be exposed by removing at least a portion of the encapsulation material. The carrier substrate may be detached from the wafer. In some embodiments, the wafer, the plurality of semiconductor devices, the adhesive material, and at least a portion of the carrier substrate may be positioned within a mold recess exhibiting an inner diameter greater than a diameter of the carrier substrate.

In-process semiconductor wafers produced by such methods may include, for example, a wafer of semiconductor material and a plurality of semiconductor devices located on an active surface of the wafer. An encapsulation material may be located on the active surface of the wafer and may surround at least side surfaces of each semiconductor device of the plurality of semiconductor devices. A side surface of the encapsulation material may be at least substantially flush with a side surface of the wafer.

Systems for processing semiconductor wafers may include, for example, a wafer of semiconductor material and a plurality of semiconductor devices located on an active surface of the wafer. A mold member may include a recess extending into the mold member, the recess being sized and shaped to at least partially receive the wafer into the recess. An inner diameter of the mold member defining the recess may be greater than an outer diameter of the wafer. In some embodiments, a carrier substrate may be secured to the wafer on a side of the wafer opposing the active surface by an adhesive material positioned between the wafer and the carrier substrate, and the inner diameter of the mold member defining the recess may be greater than a diameter of the carrier substrate.

Figure 6:
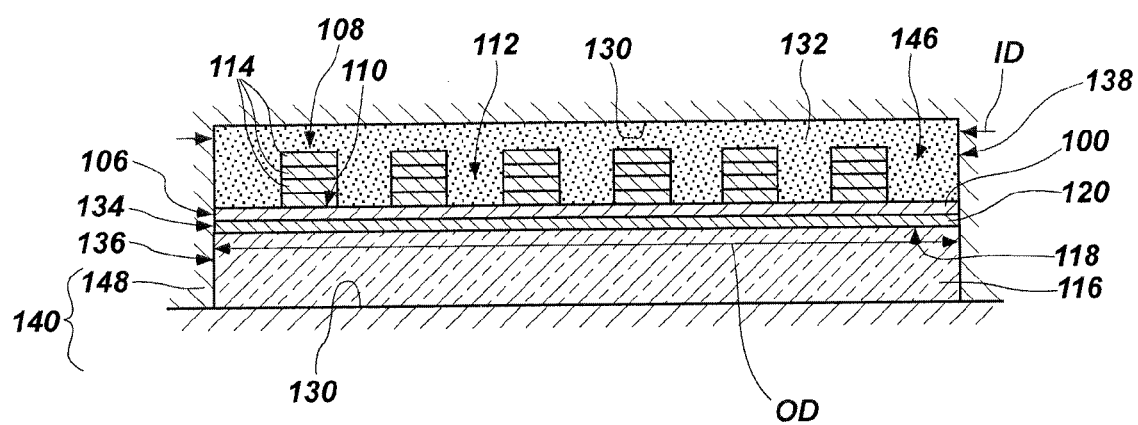
FIG. 6 is a cross-sectional view of the wafer of FIG. 1 in another embodiment of an encapsulation mold.

FIG. 6 is a cross-sectional view of the wafer 100 of FIG. 1 in another embodiment of an encapsulation mold 140. An inner diameter ID of a recess 146 defined by an upper mold member 148 may be closer to the outer diameter OD of the wafer 100 than that of the upper mold member 124 of FIG. 3, while remaining greater than the outer diameter OD of the wafer 100. In addition, the diameter D of the carrier substrate 116 may be at least substantially equal to the outer diameter OD of the wafer 100. For example, the inner diameter ID of the recess 146 may be greater than the diameter D of the carrier substrate 116 and may be between about 0.0001% and about 1% greater than the outer diameter OD of the wafer 100. More specifically, the inner diameter ID of the recess 146 may be, for example, between about 0.0002% and about 0.5% greater than the outer diameter OD of the wafer 100. As a specific, nonlimiting example, the inner diameter ID of the recess 146 may be between about 0.0003% and about 0.1% (e.g., about 0.005%) greater than the outer diameter OD of the wafer 100. The inner diameter ID of the recess 146 may be, for example, about 300 microns or less greater than the outer diameter OD of the wafer 100. More specifically, the inner diameter ID of the recess 146 may be, for example, about 100 microns or less greater than the outer diameter OD of the wafer 100. As a specific, nonlimiting example, the inner diameter ID of the recess 146 may be about 50 microns or less (e.g., about 10 microns) greater than the outer diameter OD of the wafer 100.

Encapsulation material 132 may be positioned in the mold 140 over exposed surfaces of the wafer 100 and exposed surfaces of the semiconductor devices 108 on the active surface 102. More specifically, encapsulation material 132 in a flowable state may be dispensed into the mold 140 on the active surface 102 to surround the semiconductor devices 108, each side surface 106 of the wafer 100, each side surface 134 of the adhesive material 120, and the carrier substrate 116 remaining free from contact with the encapsulation material 132. As a specific, nonlimiting example, encapsulation material 132 may flow into the recess 146 of the mold 140 under vacuum to contact and cover the active surface 102 of the wafer 100 and to surround the exposed side and, optionally, top surfaces of the semiconductor devices 108, each side surface 106 of the wafer 100, each side surface 134 of the adhesive material 120, and the carrier substrate 116 remaining free from encapsulation material 132. The encapsulation material 132 may subsequently be cured to an at least substantially solid state.

The encapsulation material 132 may remain at least substantially flush with at least one side surface 106 of the wafer 100. For example, each side surface 138 of the encapsulation material 132 may be at least substantially flush with a corresponding side surface 106 of the wafer 100. More specifically, a single, annular side surface 138 defined by the encapsulation material 132, which may exhibit a circular cross-sectional shape, may be at least substantially flush with a corresponding, annular side surface 106 of the wafer 100, which may similarly exhibit a circular cross-sectional shape. In other words, the side surface 138 defined by the encapsulation material 132 and the side surface 106 defined by the wafer 100 may cooperatively define a contiguous, uninterrupted side surface. More specifically, there may be no ledge defined by the periphery of the wafer 100, which may not project from the side surface 138 of the encapsulation material 132. By confining the encapsulation material 132 to remain flush with the side surface 106 of the wafer 100 when positioning the encapsulation material 132 on the active surface 102, none of the encapsulation material 132 may require removal before detaching the wafer 100 from the carrier substrate 116.

The wafer 100, the semiconductor devices 108 on the active surface 102 of the wafer 100, and the encapsulation material 132 covering the active surface 102 of the wafer 100 may be removed from the adhesive material 120 and the carrier substrate 116. For example, the adhesive material 120 may be heated to weaken its attachment to the wafer 100. The wafer 100 and carrier substrate 116 may then be detached from one another by sliding one or both of the wafer 100 and the carrier substrate 116 laterally with respect to one another until they are no longer secured to one another.

In other words, methods of processing semiconductor wafers may involve, for example, encapsulating an active surface and a plurality of semiconductor devices located on the active surface of the wafer in an encapsulation material to cause a side surface defined by the encapsulation material to be at least substantially flush with a side surface of the wafer. The wafer may be secured to a carrier substrate on a side of the wafer opposing the active surface by an adhesive material positioned between the wafer and the carrier substrate. The carrier substrate may subsequently be detached from the wafer. In some embodiments, the wafer and the plurality of semiconductor devices may be positioned within a mold recess exhibiting an inner diameter greater than an outer diameter of the wafer and less than a diameter of the carrier substrate.

Systems for processing semiconductor wafers may include, for example, a wafer of semiconductor material and a plurality of semiconductor devices located on an active surface of the wafer. A mold member may include a recess extending into the mold member, the recess being sized and shaped to at least partially receive the wafer into the recess. An inner diameter of the mold member defining the recess may be greater than an outer diameter of the wafer. In some embodiments, a carrier substrate may be secured to the wafer on a side of the wafer opposing the active surface by an adhesive material positioned between the wafer and the carrier substrate, and the inner diameter of the mold member defining the recess may be less than a diameter of the carrier substrate.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of processing a semiconductor wafer, comprising:
   encapsulating in an encapsulation material:
      an active surface and each side surface of a wafer of semiconductor material,
      a plurality of semiconductor devices located on the active surface of the wafer,
      an exposed side surface of an adhesive material located on a back side surface of the wafer, and
      at least a portion of a side surface of a carrier substrate, the carrier substrate secured to the wafer by the adhesive material;
   exposing at least a portion of the side surface of the adhesive material by removing at least a portion of the encapsulation material; and
   detaching the carrier substrate from the wafer.

2. The method of claim 1, wherein exposing at least a portion of the side surface of the adhesive material by removing the at least a portion of the encapsulation material comprises trimming the at least a portion of the encapsulation material starting from a periphery of the encapsulation material and proceeding radially inwardly until the adhesive material is exposed.

3. The method of claim 1, wherein exposing the at least a portion of the side surface of the adhesive material by removing the at least a portion of the encapsulation material comprises exposing the adhesive material to a depth of between 1% and 80% of a total thickness of the adhesive material.

4. The method of claim 3, wherein exposing the adhesive material to the depth of between 1% and 80% of the total thickness of the adhesive material comprises exposing the adhesive material to a depth of between 25% and 65% of the total thickness of the adhesive material.

5. The method of claim 1, wherein exposing the at least a portion of the side surface of the adhesive material by removing the at least a portion of the encapsulation material further comprises removing encapsulation material from a periphery of the wafer to expose a side surface of the wafer.

6. The method of claim 5, wherein removing encapsulation material from the periphery of the wafer to expose the side surface of the wafer comprises rendering a side surface of the encapsulation material located on the active surface of the wafer at least substantially flush with the side surface of the wafer.

7. The method of claim 1, wherein exposing the at least a portion of the side surface of the adhesive material by removing the at least a portion of the encapsulation material further comprises removing a portion of the adhesive material proximate a periphery of the wafer.

8. The method of claim 1, wherein exposing at least a portion of the side surface of the adhesive material by removing the at least a portion of the encapsulation material further comprises removing a portion of the semiconductor material of the wafer at a periphery of the wafer.

9. The method of claim 8, wherein removing the portion of the semiconductor material of the wafer at the periphery of the wafer comprises reducing a diameter of the wafer by between about 0.05% and about 5%.

10. The method of claim 8, wherein removing the portion of the semiconductor material of the wafer at the periphery of the wafer comprises reducing a diameter of the wafer by about 10 mm or less.

11. The method of claim 1, wherein exposing at least a portion of the side surface of the adhesive material by removing the at least a portion of the encapsulation material further comprises leaving a portion of the encapsulation material on at least the side surface of the carrier substrate.

12. The method of claim 1, wherein encapsulating the active surface and each side surface of the wafer, the plurality of semiconductor devices, the exposed side surface of the adhesive material, and the at least a portion of the side surface of the carrier substrate in the encapsulation material comprises:

positioning the wafer, the plurality of semiconductor devices, the exposed side surface of the adhesive material, and the at least a portion of the side surface of the carrier substrate within a mold recess exhibiting a larger inner diameter than an outer diameter of the wafer;

flowing encapsulation material into the mold recess; and curing the encapsulation material.

13. The method of claim 12, wherein positioning the wafer within the mold recess exhibiting the larger inner diameter than the outer diameter of the wafer comprises positioning the wafer within the mold exhibiting the inner diameter between about 0.001% and about 10% greater than the outer diameter of the wafer.

14. The method of claim 12, wherein positioning the wafer within the mold recess exhibiting the larger inner diameter than the outer diameter of the wafer comprises positioning the wafer within the mold exhibiting the inner diameter about 5 mm or less greater than the outer diameter of the wafer.

15. The method of claim 1, wherein encapsulating the plurality of semiconductor devices located on the active surface of the wafer comprises surrounding at least side surfaces of stacks of semiconductor dice on the active surface of the wafer.

16. The method of claim 1, wherein detaching the carrier substrate from the wafer comprises heating the adhesive material and moving at least one of the carrier substrate and the wafer laterally relative to the other of the carrier substrate and the wafer to detach the carrier substrate from the wafer.

* * * * *

UNITED STATES PATENT AND TRADEMARK OFFICE
CERTIFICATE OF CORRECTION

| | |
|---|---|
| PATENT NO. | : 9,337,064 B2 |
| APPLICATION NO. | : 14/485973 |
| DATED | : May 10, 2016 |
| INVENTOR(S) | : Wei Zhou et al. |

Page 1 of 1

It is certified that error appears in the above-identified patent and that said Letters Patent is hereby corrected as shown below:

In the specification:

COLUMN 6,    LINE 44,    change "D of for example" to --D of, for example,--

Signed and Sealed this
Fifth Day of July, 2016

Michelle K. Lee
*Director of the United States Patent and Trademark Office*